(12) United States Patent
Schulz et al.

(10) Patent No.: US 7,205,768 B2
(45) Date of Patent: Apr. 17, 2007

(54) CONNECTION LEAD FOR AN ELECTRICAL ACCESSORY DEVICE OF AN MRI SYSTEM

(75) Inventors: Volkmar Schulz, Hamburg (DE); Bernhard Gleich, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 1 day.

(21) Appl. No.: 10/531,542

(22) PCT Filed: Oct. 15, 2003

(86) PCT No.: PCT/IB03/04589

§ 371 (c)(1), (2), (4) Date: Apr. 15, 2005

(87) PCT Pub. No.: WO2004/038443

PCT Pub. Date: May 6, 2004

(65) Prior Publication Data

US 2005/0218897 A1    Oct. 6, 2005

(30) Foreign Application Priority Data

Oct. 23, 2002  (DE) ............................... 102 49 239

(51) Int. Cl.
*G01V 3/00* (2006.01)
*A61B 5/055* (2006.01)

(52) U.S. Cl. ..................... 324/322; 324/318; 600/423; 600/433; 600/434; 600/435

(58) Field of Classification Search .................. None
See application file for complete search history.

(56) References Cited

U.S. PATENT DOCUMENTS 3,081,428 A * 3/1963 Fowler ....................... 324/322

| | | | |
|---|---|---|---|
| 5,258,718 A | * 11/1993 | Duerr | ......................... 324/322 |
| 5,294,886 A | 3/1994 | Duerr | |
| 5,807,253 A | 9/1998 | Dumoulin et al. | |
| 6,284,971 B1 | 9/2001 | Atalar et al. | |

(Continued)

FOREIGN PATENT DOCUMENTS

GB     2 295 674 A     6/1996

(Continued)

*Primary Examiner*—Diego Gutierrez
*Assistant Examiner*—Tiffany A. Fetzner

(57) ABSTRACT

A magnetic resonance imaging apparatus is provided with one or more electrical accessory devices, for example, catheters (10) or RF body coils (6), which are intended for use during the examination of an object, as well as with a connection lead (13) which is arranged so as to extend through an examination zone (1) of the magnetic resonance imaging apparatus, which zone can be exposed to an RF field, and to connect the accessory device to a connection unit (12). In order to avoid heating of the connection lead (13) due to currents induced in the connection lead by the RF field, which currents could lead to injury of a patient or damage of the accessory device or the connection unit (12), the connection lead (13) comprises at least one lead segment (131, 132, . . . ) which has a length which is limited by at least one inductive coupling element, e.g. a transformer (141, 142, . . . ; 161, 162, . . . ) and is unequal to n*/2, where denotes the RF wavelength and n=1, 2, 3, . . . .

13 Claims, 3 Drawing Sheets

U.S. PATENT DOCUMENTS

| | | |
|---|---|---|
| 6,453,189 B1 * | 9/2002 | Gilderdale .................. 600/423 |
| 6,496,006 B1 * | 12/2002 | Vrijheid ...................... 324/318 |
| 6,593,743 B2 * | 7/2003 | de Swiet et al. ............ 324/318 |
| 6,898,454 B2 * | 5/2005 | Atalar et al. ................ 600/410 |
| 2002/0040185 A1 * | 4/2002 | Atalar et al. ................ 600/423 |
| 2002/0095084 A1 * | 7/2002 | Vrijheid et al. ............. 600/411 |
| 2002/0109503 A1 | 8/2002 | Kestler et al. |
| 2003/0080740 A1 * | 5/2003 | de Swiet et al. ............ 324/318 |

FOREIGN PATENT DOCUMENTS

| | | |
|---|---|---|
| JP | 06-254071 | 9/1994 |
| JP | 07-265278 | 10/1995 |
| WO | WO 00/77926 A1 | 12/2000 |
| WO | WO 02/42790 A1 * | 5/2002 |

* cited by examiner

CONNECTION LEAD FOR AN ELECTRICAL ACCESSORY DEVICE OF AN MRI SYSTEM

BACKGROUND

The invention relates to a magnetic resonance imaging apparatus which is provided with one or more electrical accessory devices such as, for example, RF body coils or catheters with coil elements which are intended for use during the examination of a patient or other object, as well as with a connection lead which is to be guided through an examination zone of the magnetic resonance imaging apparatus, which zone can be exposed to an RF field, and which lead is intended to connect the accessory device to a connection unit such as, for example, a power supply or control unit.

A magnetic resonance (MR) imaging apparatus is used in particular for the examination and treatment of patients. The nuclear spins of the object to be examined are then aligned by a steady main magnetic field ($B_0$ field) and are excited by RF pulses ($B_1$ field). The relaxation signals thus formed are exposed to gradient magnetic fields for the purpose of localization and are received in order to form in known manner therefrom an image of the tissue examined.

Essentially two types of construction can be distinguished, that is, the so-called open MR systems (vertical systems) in which a patient is introduced into an examination zone which is situated between the ends of a C-arm and hence is accessible from practically all sides, that is, also during the examination or treatment, and also MR systems which comprise a tubular examination space (axial systems) in which the patient is introduced.

RF coil systems serve for the transmission of the RF signals and the reception of the relaxation signals. In addition to the RE coil systems which are permanently built into the MR imaging apparatus, use is also made of RF body coils which can be flexibly arranged, for example, as a sleeve or pad around or on the region to be examined.

Furthermore, use is made of catheters which are introduced into the patient, for example, in order to take a sample of tissue during the imaging and which comprise a coil element, an oscillator or the like at the area of their tip for the purpose of localization in the image formed.

Accessory devices of this kind and other kinds are to be connected, via an electrical connection lead, to a connection unit, notably a power supply, a receiving device and/or a control device, which is situated outside the examination zone.

A problem in this respect is posed by the fact that the electrical field generated by the RF coil systems induces RF currents in the electrical connection lead leading to the relevant accessory device; these currents involve not only the risk of disturbances or destruction of the accessory device and the connection unit, but notably can give rise to substantial heating of the connection lead and, in the case of body coils and catheters, to burning of the patient when the leads are too close to the patient.

U.S. Pat. No. 6,284,971 discloses various coaxial cables for use in magnetic resonance imaging where the risk of burning of a user is to be avoided by a different configuration of the outer insulation of the cable. This outer insulation consists of a cylindrical inner shielding portion which encloses the conductor as well as of a segmented outer shielding portion, which portions are connected to one another. Between these shielding portions there may be situated a dielectric material having a comparatively high relative permittivity. In other embodiments conductive elements are provided at the ends of the segmented outer shielding portions, or such ends are connected to the inner shielding portion via a capacitor.

Cable structures of this kind, however, are comparatively voluminous, complex and expensive and the results that can be achieved thereby in respect of suppression of signals induced by the RF pulses are often inadequate, in particular in the case of high RF field strengths.

SUMMARY

Therefore, it is a general object of the invention to provide a possibility of avoiding at least substantially the risk to a patient which is caused by the heating of leads guided through an examination zone of a magnetic resonance imaging apparatus.

It is notably an object to provide a magnetic resonance imaging apparatus with one or more accessory devices, such as RF body coils and catheters, in which the currents induced by RF pulses ($B_1$ field) in the connection leads leading to these accessory devices do not constitute a risk for the patient or the accessory device or the connection unit.

It is also an object to provide an accessory device of the kind set forth with an electrical connection lead which enables an at least substantially disturbance-free connection to be established with a connection unit, for example, a power supply device, receiving device and/or control device, during use in an examination zone of an MR imaging apparatus, that is, without the risk of burning of a patient by the connection lead or of damaging of the connection unit by RF currents induced in the connection lead.

The object is achieved in one aspect by means of a magnetic resonance imaging apparatus which is provided with at least one electrical accessory device for use during the examination of an object, as well as with a connection lead which is to be guided through an examination zone of the magnetic resonance imaging apparatus, which zone can be exposed to an RF field, and which lead is intended to connect the accessory device to a connection unit, at least one lead segment, having a length which is limited by at least one inductive coupling element and is unequal to $n*\lambda/2$, being connected in the connection lead, where $\lambda$ denotes the RF wavelength and $n=1, 2, 3, \ldots$.

Special advantages of these solutions include inter alia in that the endangering of the patient by heating of the connection lead is reliably precluded for practically all field strengths of the RF field so that the connection lead can be installed directly in the bed of the patient. The risk of damaging of a connection unit connected to the connection lead, notably by RF currents induced in the connection lead, is at least substantially precluded.

Advantages of the present application will be apparent to those of ordinary skill in the art upon reading and understanding the following detailed description.

BRIEF DESCRIPTION OF THE DRAWINGS

Further details, features and advantages of the invention will become apparent from the following description of preferred embodiments which is given with reference to the drawing. Therein.

DETAILED DESCRIPTION

Figure 1:
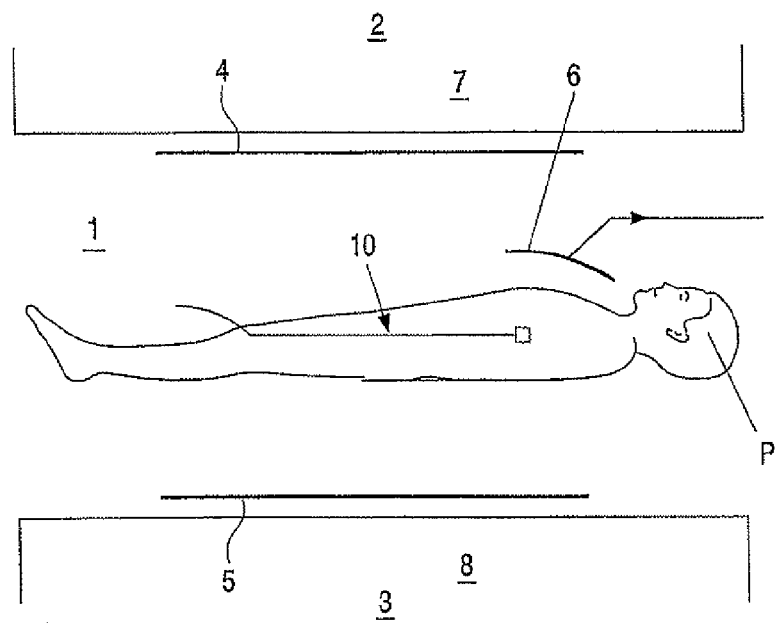
FIG. 1 is a diagrammatic side elevation of an MR imaging apparatus.
Figure 1:
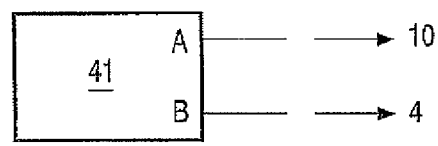

FIG. 1 shows the components of an open MR imaging apparatus which are of essential importance in relation to the generation and picking up of magnetic fields in an examination zone 1. Above and underneath the examination zone 1 there are provided respective magnet systems 2, 3 which serve to generate an essentially uniform main magnetic field ($B_0$ field for magnetizing the object to be examined, that is, for aligning the nuclear spins) whose magnetic flux density (magnetic induction) may be of the order of magnitude of from some tenths of Tesla to some Tesla. The main magnetic field essentially extends through a patient P in a direction perpendicular to the longitudinal axis of the patient (that is, in the x direction).

Planar or at least approximately planar RF conductor structures (surface resonators) in the form of RF transmission coils 4 serve to generate RF pulses ($B_1$ field) of the MR frequency whereby the nuclear spins are excited in the tissue to be examined, said RF transmission coils being arranged on the respective magnet systems 2 and 3. RF receiving coils 5 serve to pick up subsequent relaxation events in the tissue; these coils may also be formed by surface resonators provided on one of the magnet systems 2, 3. A common RF surface resonator can also be used for transmission and reception if it is suitably switched over, or the two RF surface resonators 4, 5 can serve for the alternating transmission and reception in common.

Furthermore, for the spatial discrimination and resolution of the relaxation signals emanating from the tissue of a patient P (localization of the excited states) there are also provided a plurality of gradient magnetic field coils 7, 8 whereby three gradient magnetic fields are generated which extend in the direction of the x axis. A first gradient magnetic field then varies essentially linearly in the direction of the x axis, while a second gradient magnetic field varies essentially linearly in the direction of the y axis, and a third gradient magnetic field varies essentially linearly in the direction of the z axis.

Electrical accessory devices are required for given examinations. Such devices are, for example, RF body coils 6 which are used in addition to or as an alternative for the planar RF receiving coils 5 and which are arranged as RF receiving coils directly on the patient P or the zone to be examined. These RF body coils 6 are generally constructed as flexible pads or sleeves.

Furthermore, in order to carry out the treatment on the patient P or to extract a tissue sample or to determine tissue parameters, use is often made of a catheter 10 which is introduced into the patient and whose position is to be visualized on a display screen.

Various passive and active methods are known for this purpose.

In the case of a passive method, for example as described in WO 99/19739, one or more small resonant oscillatory circuits on the tip of the catheter can be made visible in the MR image because of the fact that they lead to an increase of the RF field ($B_1$ field) in their direct vicinity during MR imaging, and hence also increase the magnetization of the neighboring nuclear spins. The transmission and/or receiving unit 11 is then formed by a receiving coil in the simplest case. However, it may additionally comprise sensors which pick up given properties of the surrounding tissue.

In the case of an active method it is possible to switch between two modes of operation in an alternating fashion, for example, by means of a switching unit 41 which is connected to the catheter 10 by way of a first output A and to the RF transmission coils 4 by means of a second output B. In the first mode of operation an MR image is generated in known manner by means of the MR apparatus, whereas in the second mode of operation a local nuclear magnetization is excited, using an activated transmission and/or receiving unit 11 which is arranged on the tip of the catheter, by transmission of RF pulses, the resultant relaxation events being received by the RF receiving coils 5, 6. The signal received itself serves to reproduce the position of the tip of the catheter in the MR image.

Figure 2:
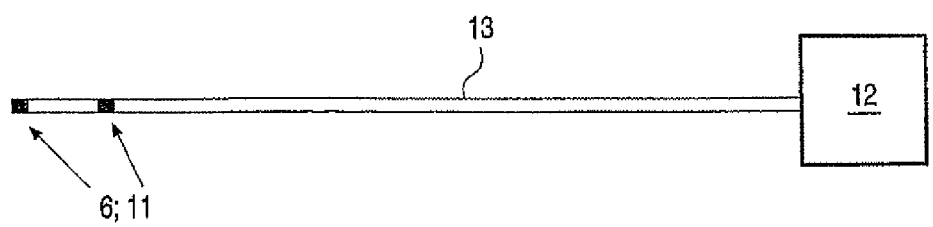
FIG. 2 is a diagrammatic representation of an accessory device.

FIG. 2 is a diagrammatic representation of an accessory device in the form of a catheter. On the tip of the catheter (or in a location at a slight distance therefrom) there is arranged a transmission and/or receiving unit 11, for example, in the form of a microchip on which the necessary components (and possibly also the sensors) are realized. At the end of the catheter which is situated outside the patient there is provided a connection unit 12 in the form of a power supply unit and/or a receiving device and/or a control device which is connected, via a connection lead 13 which is guided through the catheter, to the transmission and/or receiving unit 11 and via which the transmission and/or receiving unit 11 is activated and possibly the measuring values from the sensors are conducted.

In the case of an accessory device in the form of RF body coils 6, such coils are also connected, via an electrical connection lead 13, to a corresponding connection unit 12 (power supply, receiving device and/or control device).

Figure 3:
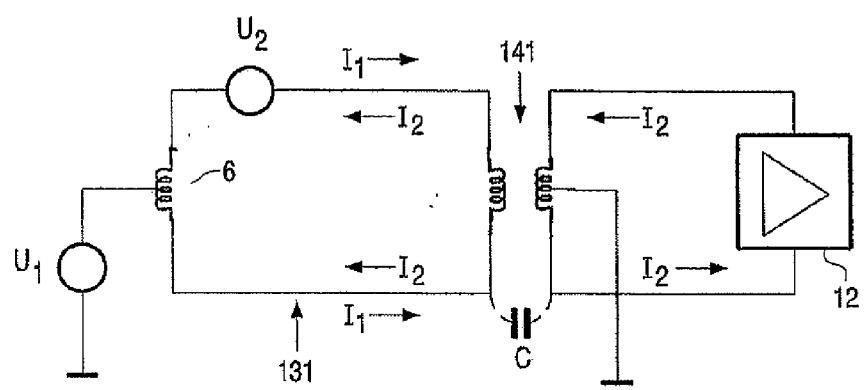
FIG. 3 shows a first equivalent diagram of a connection lead in accordance with the invention.
Figure 4:
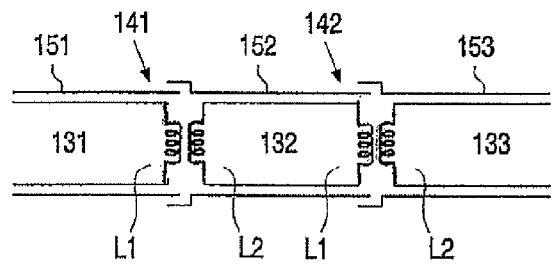
FIG. 4 is a diagrammatic representation of a first embodiment of the connection lead.
Figure 5:
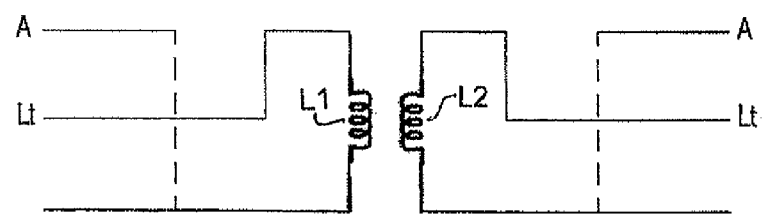
FIG. 5 is a diagrammatic representation of a second embodiment of the connection lead.
Figure 7:
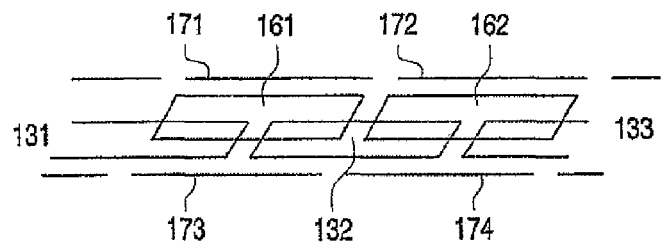
FIG. 7 is a diagrammatic representation of a third embodiment of the connection lead.

FIG. 3 shows a first electrical equivalent diagram of a connection lead 13 in accordance with the invention; the operating principle of the embodiments shown in the FIGS. 4, 5 and 7 will be illustrated on the basis thereof.

The RF pulses ($B_1$ field) transmitted by the RF transmission coils 4 induce, for example, in an RF body coil 6 as well as in the part of the connection lead 13 which extends through the field of the RF transmission coils 4, a common mode signal which is generated by a first voltage source $U_1$ in the equivalent diagram. The common mode signal causes a corresponding first current $I_1$ in the connection lead 13. The signals induced by the subsequent MR relaxation events in the RF body coil 6 (differential mode signals) are represented by a second voltage source $U_2$ (useful voltage) in the equivalent diagram and give rise to a second current $I_2$ in the connection lead 13.

The connection lead 13 has a plurality of lead segments 131, 132, . . . . The length of these segments is unequal to $n*\lambda/2$ (n=1, 2, 3, . . . ), where $\lambda$ is the wavelength with which the RF pulses are transmitted. The segments 131, 132, . . . are, therefore, non-resonant for the common mode signal. The length of the segments is preferably as small as possible and lies notably between $\lambda/4$ and $\lambda/8$. Respective transformers 141, 142, . . . , are provided for connecting the individual lead segments 131, 132, . . . to one another; the differential mode signals can be transmitted via said transformers so as to be conducted via the connection lead 13. The transformers 141, 142 are proportioned such that the coupling capacitance C between the primary side and the secondary side is as small as possible and preferably not smaller than 250 Ohm (or larger than 250 Ohm in an absolute sense).

A significant temperature increase at the area of the patient is thus avoided even in the case of high RF field strengths (for example, 3 Tesla) as well as in the case of a large number of RF coils 4, thus avoiding damaging and/or failure of the accessory device 6 and the connection unit 12.

In the case where the RF body coil is composed of a plurality of individual conductor segments (antenna segments) which can be connected to one another or separated from one another by means of diodes in order to achieve given reception characteristics, the power supply and the switching of the diodes can be realized by means of alternating voltage signals which are generated by the connection unit 12 and conducted via the connection lead 13. At a frequency of, for example, 2 MHz of the power supply and of, for example, 20 MHz of the switching voltage (that is, frequencies clearly beyond the range of the MR frequency, but within the transmission bandwidth of the connection lead), the connection lead 13 exhibits no significant attenuation in this respect.

The connection lead 13 can be realized, for example, in conformity with a first embodiment as shown in FIG. 4. This is a two-wire lead (for example, a twisted pair), three lead segments 131, 132, 133 of which are shown. The lead segments are coupled to one another via a respective transformer 141, 142 whose primary and secondary windings L1, L2 terminate the respective lead segment. Optionally, the lead segments 131, 132, 133 may be provided with a shield 151, 152, 153; the shields then overlap one another in a contactless manner at the area of the transformers 141, 142.

FIG. 5 is a diagrammatic representation of a second embodiment of the invention in which a coaxial cable is used as the connection lead 13 instead of the two-wire lead shown in FIG. 4. In this case the primary and secondary windings L1, L2 of the transformers 141, . . . are connected between the conductor Lt and the shielding A of the individual segments of the coaxial cable.

Figure 6:
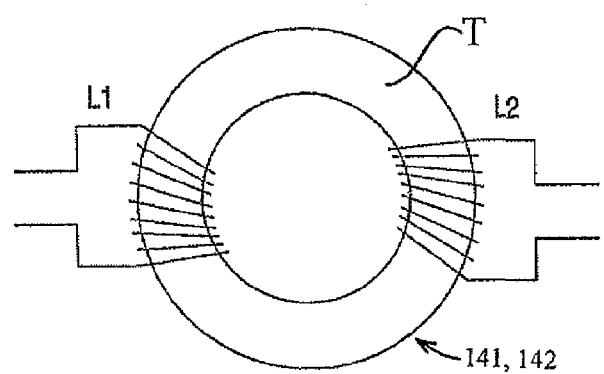
FIG. 6 shows a transformer used in the connection lead in conformity with the FIGS. 4 and 5.

In conformity with FIG. 6 the transformers 141, 142 may comprise, for example, a toroid T on which the primary winding L1 and the secondary winding L2 are wound. The two windings L1, L2 may also encompass the entire toroid T and be arranged one over the other.

The material of the toroid T should have an as low as possible relative permitivity and the winding wires should be as thin as possible. An attenuation of less than 1 dB can thus be achieved. In the case of transformers which are situated outside the range of the main magnetic field, the toroid may also be made of a magnetic material whereby particularly favorable properties can be achieved.

Alternatively, if desired, a metallic transformer core can also be dispensed with and the transformer may be composed of air coils wound around a coil former made of a foamy material.

At both ends of the connection lead 13 the transformers may be constructed so as to form part of the RF body coil 6 (or a transmission and/or receiving unit 11 of a catheter 10) or of a connector on the connection unit 12.

When the (discrete) transformers 141, 142, . . . are not desired along the connection lead 13 for mechanical or other reasons, it is possible to realize the transformers in the form of conductor loops 161, 162, . . . . FIG. 7 shows such a third embodiment of the connection lead 13; this embodiment is advantageous notably when the connection lead 13 must have a particularly small cross-section.

This connection lead 13 is again composed of a plurality of lead segments 131, 132, 133 with two cores, which are short-circuited at the respective ends of each lead segment. The conductor segments are again inductively coupled to one another. To this end use is made of said conductor loops 161, 162 which are arranged each time over end zones of neighboring lead segments 131, 132 and 132, 133 etc. This connection lead 13 can be realized, for example, by way of a strip-like board or other, also flexible carrier material (for example, a foil) which is provided on one side with the lead segments 131, 132, 133, . . . and with the conductor loops 161, 162, . . . on the other side.

Optionally, shields 171, 172; 173, 174 may also be provided in this third embodiment, said shields being arranged on the conductor loops 161, 162 and/or the lead segments 131, 132, 133.

Figure 8:
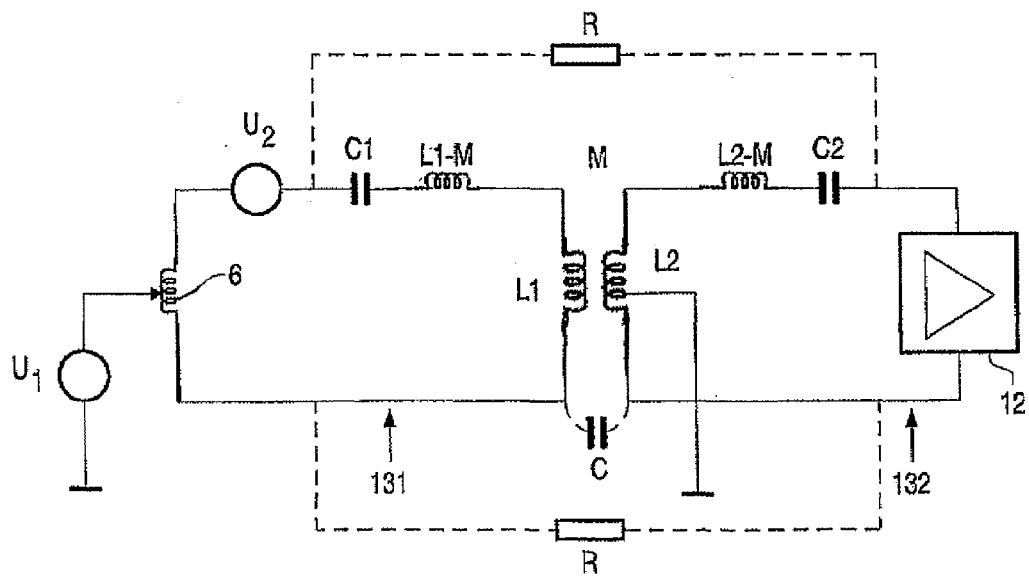
FIG. 8 shows a second equivalent diagram of a connection lead in accordance with the invention.

Finally, FIG. 8 shows a second equivalent diagram illustrating a fourth embodiment of a connection lead in accordance with the invention.

In this equivalent diagram the voltage generated by a first voltage source $U_1$ again represents the voltage which is induced, by the RF pulses emitted by the RF transmission coils 4, in an RF body coil 6 as well as in the part of the connection lead 13 which extends through the field of the RF transmission coil 4 (common mode signal). A second voltage source $U_2$ represents the (differential mode) signals induced in the RF body coil 6 by the MR relaxation events. The two lead segments 131, 132 shown in FIG. 8 are again connected to one another via a transformer having a primary winding L1 and a secondary winding L2 in conformity with the foregoing description. The transformer is shown in the form of a known T equivalent circuit consisting of a parallel mutual inductance M of the two windings L1, L2 as well as the serial inductances L1-M and L2-M.

Essential in this respect is a first capacitor C1 which is connected in series with the first lead segment 131, as well as a second capacitor C2 which is connected in series in the second lead segment 132. The capacitance of the capacitors is chosen to be such that they form a resonant circuit in conjunction with the inductance of the transformer, that is, $1/\omega C1 = \omega L1$ and $1/\omega C2 = \omega L2$, and that this resonance condition is satisfied for the circuit frequency $\omega$ of a signal to be conducted via the connection lead, that is, for the differential mode signal, but not for the common mode signals.

A very high and at the same time very narrowband coupling of the lead segments 131, 132 can thus be achieved for the MR relaxation signals. Moreover, the coupling capacitance C between the windings L1, L2 of the transformer can thus be kept even smaller.

In as far as direct voltage signals are to be conducted via the connection lead 13, for example, in order to bias diodes between parts of the body coil 6, the two capacitors C1, C2 as well as the intermediate transformer can be bridged by means of ohmic resistances R. In respect of the bridging of the transformer, of course, this also holds in this sense for the first equivalent diagram shown in FIG. 3 (not depicted therein).

The described connection leads offer special advantages for the application of switchable RF body coils 6 which are used notably in the case of SENSE (Sensitivity Encoding) imaging methods, because on the one hand disturbance-free power supply and switching over of the various parts of the RF body coils 6 by means of diodes as well as the transfer of the received relaxation signals is thus possible as described above, while on the other hand there is no risk of the patient being burnt due to resonance effects caused by the RF power emitted by the RF transmission coil 4 and the inherent heating of the connection lead 13. The connection lead 13 can thus be arranged directly in the bed of the patient. The risk for the accessory device 6, 11 or the connection unit 12 is also precluded to a high degree. The same also holds for high RF field strengths.

The use of such connection leads requires substantially fewer system modifications than, for example, the optical transmission of the relevant signals from and to the RF body coils, catheters or other accessory devices.

In comparison with the known solutions, notably the connection leads 13 in conformity with the first up to and including the third embodiment have a comparatively large bandwidth so that, for example, it is also possible to transfer a plurality of receiving signals via a connection lead.

Finally, the same or even simpler connectors can be used for connecting the connection lead 13 to the relevant connection unit 12 (power supply, receiving device and/or control device).

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging apparatus comprising:
   an accessory device;
   a connection lead of the accessory device which is configured to extend through an examination zone of a magnetic resonance imaging system during a magnetic resonance examination in which RF fields are applied in the examination zone, the connection lead including:
   a multiplicity of lead segments, each lead segment including two conductive wires,
   a plurality of transformers, each of the plurality of transformers including a first winding connected across the wires of one of the lead segments and a second winding connected across the wires of an adjacent lead segment, such that heating of the connection lead is avoided.

2. A magnetic resonance imaging apparatus as claimed in claim 1 in which a length of each lead segment is in the range of from $\lambda/4$ to $\lambda/8$.

3. A magnetic resonance imaging apparatus as claimed in claim 1, in which the connection lead wire lead or a coaxial lead.

4. A magnetic resonance imaging apparatus as claimed in claim 1, in which each transformer is bridged by ohmic resistors in order to transfer direct voltage signals via the connection lead.

5. A magnetic resonance imaging apparatus as claimed in claim 1, in which at least one capacitive element is connected with each transformer so as to form a resonant circuit with the resonance condition of said resonant circuit being satisfied for the frequency of a signal to be transferred via the connection lead.

6. A magnetic resonance imaging apparatus as claimed in claim 1, wherein the accessory device includes a body coil configured for use during the magnetic resonance examination of an object, the connection lead being arranged so as to extend through the examination zone and be exposed to an the RF fields at least one of the lead segments having a length which is unequal to $n*\lambda/2$, where $\lambda$ denotes the RF wavelength and $n=1, 2, 3, \ldots$.

7. A magnetic resonance imaging apparatus as claimed in claim 1 wherein the accessory includes a catheter with a transmission and/or receiving unit configured for use during the examination procedure of an object in the examination zone, the connection lead being arranged so as to extend through the examination zone in order to connect the transmission and/or receiving unit to a connection unit, at least one of the lead segments, having a length which is unequal to $n*\lambda/2$, where $\lambda$ denotes the wavelength of the applied RF fields and $n=1, 2, 3, \ldots$.

8. A magnetic resonance imaging apparatus which is provided with at least one electrical accessory device configured for use during the examination of an object, as well as with a connection lead which is to be guided through an examination zone of the magnetic resonance imaging apparatus, which zone can be exposed to an RF field, and which lead is intended to connect the accessory device to a connection units;
   the connection lead having at least one lead segment that has a length which is limited by at least one inductive coupling element and is unequal to $n*\lambda/2$, which is connected in the connection lead, where $\lambda$ denotes the RF wavelength and $n=1, 2, 3, \ldots$, the inductive coupling element being a transformer, the transformer being formed by a toroid as well as a primary and secondary winding wound thereon.

9. A magnetic resonance imaging apparatus as claimed in claim 8, in which the accessory device is an RF body coil or a catheter with a transmission and/or receiving unit.

10. A magnetic resonance imaging apparatus as claimed in claim 8, wherein each toroid al transformer is bridged by ohmic resistors.

11. A magnetic resonance imaging apparatus comprising:
    a magnetic resonance accessory including at least one RF coil;
    a connection lead connected with the accessory and configured to extend through an examination zone during a magnetic resonance imaging process, the connection lead including:
    a plurality of conductive, lead segment loops arranged end to end;
    each conductive lead segment loop having a length unequal to $n*\lambda/2$,
    where $\lambda$ denotes RF wavelength of RF signals applied in the examination zone during the imaging process and n is an integer; and
    a plurality of inductive coupling conductor loops, each lead segment loops and over end zones of the neighboring lead segments in order to inductively couple the pair of lead segment loops to another.

12. A magnetic resonance imaging apparatus as claimed in claim 11, wherein the accessory includes an RF coil or a catheter with a transmission and/or receive unit.

13. A magnetic resonance imaging apparatus as claimed in claim 11, wherein each lead segment loop has a length in a range of $\lambda/4$ to $\lambda/8$.

* * * * *